US011211560B2

(12) United States Patent
Han

(10) Patent No.: US 11,211,560 B2
(45) Date of Patent: Dec. 28, 2021

(54) SELF-ASSEMBLY OF NANOSTRUCTURES

(71) Applicant: International Business Machines Corporation, Armonk, NY (US)

(72) Inventor: Shu-Jen Han, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 266 days.

(21) Appl. No.: 16/689,371

(22) Filed: Nov. 20, 2019

(65) Prior Publication Data

US 2020/0091433 A1   Mar. 19, 2020

Related U.S. Application Data

(62) Division of application No. 15/952,570, filed on Apr. 13, 2018, now Pat. No. 10,672,986.

(51) Int. Cl.
*H01L 51/00* (2006.01)
*C01B 32/168* (2017.01)
(Continued)

(52) U.S. Cl.
CPC ........ *H01L 51/0012* (2013.01); *C01B 32/168* (2017.08); *H01L 51/0003* (2013.01);
(Continued)

(58) Field of Classification Search
CPC .......... C08K 3/041; C08K 3/04; B82Y 10/00; B82Y 40/00; G11B 9/1409; G11B 9/1418; H01L 35/16; H01L 35/18; H01L 35/22
See application file for complete search history.

(56) References Cited

U.S. PATENT DOCUMENTS 7,662,299 B2 *  2/2010  Subramanian ......... B82Y 10/00
                                                    216/11
7,951,424 B2    5/2011  Afzali-Ardakani et al.
(Continued)

OTHER PUBLICATIONS

H. Park et al., "High-density integration of carbon nanotubes via chemical self-assembly," Nature Nanotechnology, vol. 7, No. 12, 2012, pp. 787-791.
(Continued)

*Primary Examiner* — Jaehwan Oh
(74) *Attorney, Agent, or Firm* — Cantor Colburn LLP; Robert Sullivan

(57) ABSTRACT

Sub-lithographic structures configured for selective placement of carbon nanotubes and methods of fabricating the same generally includes alternating conformal first and second layers provided on a topographical pattern formed in a dielectric layer. The conformal layers can be deposited by atomic layer deposition or chemical vapor deposition at thicknesses less than 5 nanometers. A planarized surface of the alternating conformal first and second layers provides an alternating pattern of exposed surfaces corresponding to the first and second layer, wherein a width of at least a portion of the exposed surfaces is substantially equal to the thickness of the corresponding first and second layers. The first layer is configured to provide an affinity for carbon nanotubes and the second layer does not have an affinity such that the carbon nanotubes can be selectively placed onto the exposed surfaces of the alternating pattern corresponding to the first layer.

19 Claims, 3 Drawing Sheets

(51) Int. Cl.
 *B82Y 40/00* (2011.01)
 *B82Y 30/00* (2011.01)

(52) U.S. Cl.
 CPC .......... *H01L 51/0048* (2013.01); *B82Y 30/00* (2013.01); *B82Y 40/00* (2013.01); *Y10S 977/746* (2013.01); *Y10S 977/847* (2013.01); *Y10S 977/891* (2013.01)

(56) References Cited

U.S. PATENT DOCUMENTS

| | | |
|---|---|---|
| 8,084,012 B2 | 12/2011 | Afzali-Ardakani et al. |
| 9,236,477 B2 | 1/2016 | Chu et al. |
| 9,273,004 B2 | 3/2016 | Afzali-Ardakani et al. |
| 9,330,914 B2 | 5/2016 | Light et al. |
| 9,437,443 B2 | 9/2016 | Brink et al. |
| 9,466,534 B1 | 10/2016 | Brink et al. |
| 9,472,506 B2 | 10/2016 | Conkling et al. |
| 2006/0043598 A1* | 3/2006 | Kirby ................ H01L 21/76898 257/774 |
| 2019/0319191 A1 | 10/2019 | Han |

OTHER PUBLICATIONS

List of IBM Patents or Patent Applications Treated as Related; (Appendix P), Date Filed Nov. 20, 2019; 2 pages.

Z. Hu et al., "Physically unclonable cryptographic primitives using self-assembled carbon nanotubes," Nature Nanotechnology, vol. 11, No. 6, 2016, pp. 559-565.

* cited by examiner

SELF-ASSEMBLY OF NANOSTRUCTURES

DOMESTIC PRIORITY

This application is a divisional of U.S. application Ser. No. 15/952,570 entitled "SELF-ASSEMBLY OF NANO-STRUCTURES," filed Apr. 13, 2018 incorporated herein by reference in its entirety.

BACKGROUND

The present invention relates in general to nanometer-level structures and their fabrication. More specifically, the present invention relates to structures and methods of placing carbon nanotubes (CNTs) on a substrate.

Carbon nanotubes (CNTs) are promising candidates for many different applications such as sensors, supercapacitors, transparent electrodes, optoelectronics, and digital logic. To make any high-performance electronic device, one needs to precisely place the nanostructure over large areas.

SUMMARY

Embodiments of the present invention are generally directed to selective placement of carbon nanotubes and methods of fabrication. A non-limiting example of a method of forming a structure having selectively placed carbon nanotubes includes conformally depositing a first layer at a thickness of less than about 5 nanometers onto a substrate including a topographical pattern. A second layer is conformally deposited onto the first layer at a thickness of less than about 5 nanometers, wherein the first layer is a metal oxide or metal nitride, and the second layer is a non-metal oxide or metal. The process of conformally depositing the first and second layers is repeated. The surface is planarized to expose an alternating surface pattern of the first and second layers. The exposed first layer surface is functionalized with an electron-deficient compound, and a monolayer of electron-rich arene coated carbon nanotubes is selectively placed on the exposed first layer surface with the electron-deficient compound.

In another aspect of the present invention, a non-limiting example of a method of forming a structure having selectively placed carbon nanotubes includes conformally depositing a first layer at a thickness of less than about 5 nanometers onto a substrate including a topographical pattern. A second layer is conformally deposited onto the first layer at a thickness of less than about 5 nanometers, wherein the first layer has an isoelectric point greater than the second layer. The process of conformally depositing the first and second layers is repeated. A surface is planarized to expose an alternating surface pattern of the first and second layers. The exposed first layer surface is functionalized with an electron-deficient compound having a terminal acid group, wherein the isoelectric point of the first layer is greater than a pKa of the terminal acid group, and wherein the isoelectric point of the second layer is less than the pKa of the terminal acid group. A monolayer of electron-rich arene coated carbon nanotubes is selectively placed on the exposed first layer surface with the electron-deficient compound.

In another aspect of the present invention, a non-limiting example of a structure includes a topographical pattern provided in a dielectric layer including at least one opening. A planarized surface of alternating conformal first and second layers is provided in the at least one opening having a thickness of less than 5 nanometers on the dielectric layer. The planarized surface includes an alternating pattern of exposed surfaces corresponding to the first and second layer, wherein a width of at least a portion of the exposed surfaces is substantially equal to the thickness of the corresponding first and second layers, and wherein the first layer is metal oxide or a metal nitride and the second layer is a non-metal oxide or a metal. Selectively placed on the exposed surfaces corresponding to the first layer are carbon nanotubes.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The following detailed description, given by way of example and not intended to limit the description solely thereto, will best be appreciated in conjunction with the accompanying drawings, wherein like reference numerals denote like elements and parts, in which.

DETAILED DESCRIPTION

Figure 1:
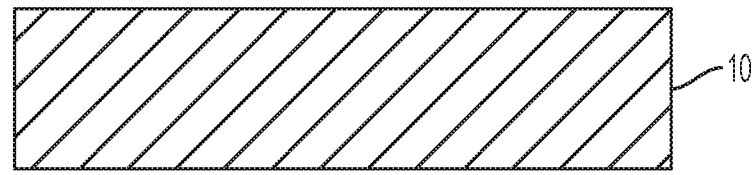
FIG. 1 depicts a cross sectional view of a substrate in accordance with one or more embodiments of the invention.

The present invention generally relates to sub-lithographic structures configured for selective placement of carbon nanotubes and methods of fabricating the same. It is often difficult to create fine patterns that extend beyond the lithographic limit, which is generally defined herein as feature sizes of less than about 5 nanometers (nm), The use of extreme ultraviolet (EUV) lithography and directed self-assembly processes have been developed for sub-lithographic technologies but these methods are relatively costly and the capability of patterning features below about 5 nm to provide selective placement of CNTs using these technologies is suspect. However, for many advanced applications, sub-5 nm resolution is highly desired. In one or more embodiments of the present invention, the prior art problems are overcome by depositing alternating thin conformal layers of different materials on topographical features to create an alternating pattern, wherein one material is functionalized to have an affinity for CNTs and the other material is selected to not have an affinity for CNTs. The alternating thin conformal layers can provide feature sizes less than the lithographic limit of about 5 nm because it is primarily controlled by the thickness of deposited films.

The film thicknesses of the alternating conformal layers are carefully controlled and extremely precise using technologies such as atomic layer deposition and chemical vapor deposition to provide the pattern of alternating layers on the topographical features. For example, film thicknesses at or below about 5 nm can be used to provide a pattern that extends well beyond the lithographic limit of existing technologies. Moreover, because alternating layers are deposited onto topography, subsequent planarization results in a fine pattern of the alternating layers at the deposited film thickness, i.e., the width of the exposed alternating surface can be substantially the same as the film thickness. Moreover, as will be described in greater detail below, islands having an affinity for CNTs or not having an affinity for CNTs can readily be formed of a desired size.

As noted above, the alternating conformal layers can include layers that are configured to have an affinity to CNTs and layers that do not have an affinity to the CNTs. The CNTs can then be selectively placed from a suspension onto only those surfaces having an affinity for the CNTs. The affinity can be due to functionalization of either the substrate or the CNTs to promote covalent or ionic bonding between the substrate and the CNTs.

Detailed embodiments of the resulting CNT nanostructures and methods for fabricating an integrated circuit including the CNT nanostructures according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The terms "substantially," "approximately," "slightly less than," and variations thereof, are intended to include the degree of error associated with measurement of the particular quantity or characteristic based upon the equipment available at the time of filing the application. For example, "substantially" can include a range of ±8% or 5%, or 2% of a given value or other characteristic.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

The term "carbon nanotube (CNT)" is used throughout the present application to include a one-dimensional nanomaterial that has a hollow cavity with nanometer-sized diameters and much, much longer lengths. In other words, the carbon nanotubes have a high aspect ratio and quantum effects become important for these systems. The nanotubes that can be used are single walled or multi-walled nanomaterials that typically have an outer diameter that is typically from about 0.8 nanometers (nm) to about 30 nm, with an outer diameter from about 1.0 nm to about 2.5 nm being more typical, and a length that is typically from about 5 nm to about 100 micrometers (μm), with a length from about 10 nm to about 10 μm being more typical. In addition to having an outer diameter, the nanotubes that can be used in the present description have an inner diameter that is typically from about 0.8 nm to about 15 nm, with an inner diameter from about 0.8 nm to about 2.5 nm being more highly typical. Suitable carbon nanotubes are further characterized as having a high aspect ratio that is typically on the order of about 5 or greater, with an aspect ratio from about 5 to about 5,000 being typical.

The term "isoelectric point" is used throughout the present application to denote the pH at which a particular molecule carries no net electrical charge.

Described herein are CNT nanostructures and methods for fabricating an integrated circuit including the CNT nanostructures. The CNT nanostructures generally include alternating layers of a first layer having an affinity for CNTs and a second layer that does not have an affinity for CNTs. In one or more embodiments, the first layer having the affinity for the CNTs is functionalized with a bifunctional precursor. The bifunctional precursor includes a first functional group for selectively anchoring the precursor to the first layer and a second functional group that provides affinity to the CNTs. By way of a non-limiting example, the second functional group can be an electron-deficient material. In this manner, when electron-rich arene coated CNTs are deposited onto an alternating pattern that includes the first and second layers, the electron-rich CNTs self-align to the electron-deficient functionalized first layer because of the polarity differences, wherein the electron-rich CNTs are attracted to and selectively interact with the exposed surfaces of the electron-deficient functionalized first layer.

Alternatively, the second functional group can have a first ionic charge moiety, which serves to form a bond with a second ionic charge moiety provided on the CNT. By contacting the first layer with a precursor solution, the first functional group (the anchoring functional group) forms a bond with first layer, thereby forming a self-assembled monolayer having a first ionic charge moiety. The first ionic charge moiety can be either positively or negatively charged. By using a charged functionality or surfactant attached to the CNT, interaction between the CNT and the first ionic charge moiety is increased that can result in increased CNT density on the first layer.

Advantageously, the methods and resulting nanostructures described herein can be used to selectively place the CNTs into sub-lithographic feature sizes of less than 5 nanometers wide. For convenience, reference will be made herein to an electron-deficient functionalized first layer. However, it should be apparent that the sub-lithographic structure as described herein can be utilized in various CNT selective placement schemes.

The first layer can generally be formed using standard deposition processes such as atomic layer deposition or chemical vapor deposition followed by selectively functionalizing an electron-deficient compound onto a selected one of the surfaces so as to form the electron-deficient functionalized first layer. Suitable materials for forming the first layer that can be selectively functionalized include, but are not limited to, a metal oxide or a metal nitride. The metal oxide includes at least one metal from group IVB, VB, VIB, VIIB, VIII or IIA (CAS version) of the Periodic Table of the Elements. Illustratively, the metal oxide can be an aluminum oxide ($Al_2O_3$), a hafnium oxide ($HfO_2$), a titanium oxide ($TiO_x$), or a zinc oxide (ZnO). Exemplary metal nitrides include silicon nitride and titanium nitride.

Likewise, the second layer can generally be formed using standard deposition processes such as atomic layer deposition or chemical vapor deposition. Suitable materials for forming the second layer (i.e., the non-electron-deficient surface) include, but are not limited to, a non-metal oxide, e.g., a silicon oxide ($Si_xO_yH_z$) or a metal such as, but not limited to, gold, palladium, copper, platinum, and the like.

The first layer has a higher isoelectric point than the second layer. Typically, the isoelectric point differential between the first layer and the second layer is at least 3 in one or more embodiments, at least 4 in one or more other embodiments, and at least 5 in still one or more other embodiments. By way of example, hafnium oxide having an isoelectric point of about 7 can be used to form the electron-deficient functionalized first layer whereas silicon dioxide having an isoelectric point of about 2 can be used for the second layer, which results in an isoelectric point differential of about 5.

Additionally, the first layer is selected to have an isoelectric point greater than the pKa of the electron-deficient compound including a terminal acid group (e.g., an acid such as hydroxamic, phosphonic, catechol) that is used for selective functionalization and the second layer has an isoelectric point less than the pKa of the electron-deficient compound. By carefully selecting the isoelectric charge of the first layer relative to second layer, a selected one of the layers can be made to selectively bind the electron-deficient compound. For example, hydroxamic acids and phosphonic acids are known to selectively bind to surfaces that are relatively basic but do not bind to surfaces which are more acidic. Self-assembly of the electron-deficient compound on the first layer will be provided due to deprotonation of the acid because the isoelectric point of the first layer is greater than the pKa of the electron-deficient compound. It is believed catechol will bind in a similar manner via deprotonation of the phenolic hydrogen. Conversely, the second layers with an isoelectric point less than the pKa of the electron-deficient compound used for the self-assembly will give worse/no directed self-assembly. This is true for silicon dioxide.

In view of the foregoing, the electron-deficient functionalized first layer can be formed by selectively reacting an electron-deficient compound including a terminal hydroxamic acid or phosphonic acid or catechol functionality with a surface having an isoelectric point greater than the pKa of the particular terminal acid group. Exemplary electron-deficient compounds are of formula (I) shown below.

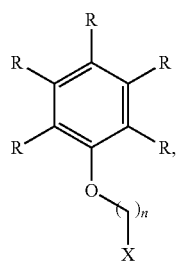

(I)

wherein R is an electron withdrawing group, n is an integer from 1 to 12, and X is hydroxamic acid, phosphonic acid or a catechol group. Exemplary electron withdrawing groups include, without limitation, fluorine groups, nitro groups, cyano groups combinations thereof, or the like. The electron-deficient compound including the terminal hydroxamic acid or phosphonic acid or catechol functionality can be solvent coated onto the substrate. Exemplary compounds include pentafluorophenoxyhydroxamic acid or pentafluorophenoxyphosphonic acid, wherein the acid moiety selectively binds the electron-deficient compound to the exposed surfaces corresponding to the first layer present on the substrate surface.

The nanostructures can be CNTs coated with electron-rich arenes, which render the CNTs soluble in organic solvent. The CNTs of the present invention can be formed by any one of several processes including, for example, arc discharge, laser ablation, high pressure carbon monoxide (HiPCO), and chemical vapor deposition (CVD) (e.g., plasma enhanced CVD).

For example, using CVD, a metal catalyst layer of metal catalyst (e.g., including nickel, cobalt, iron, or a combination thereof), is formed on a substrate (e.g., silicon). The metal nanoparticles can be mixed with a catalyst support (e.g., MgO, $Al_2O_3$, etc) to increase the specific surface area for higher yield of the catalytic reaction of the carbon feedstock with the metal particles. The diameters of the nanotubes that are to be grown can be controlled by controlling the size of the metal particles, such as by patterned (or masked) deposition of the metal, annealing, or by plasma etching of a metal layer.

The substrate including the metal catalyst layer can be heated to approximately 700° C. The growth of the CNTs can then be initiated at the site of the metal catalyst by introducing at least two gases into the reactor: a process gas (e.g., ammonia, nitrogen, hydrogen or a mixture of these) and a carbon-containing gas (e.g., acetylene, ethylene, ethanol, methane or a mixture of these).

A plasma can be also be used to enhance the growth process (plasma enhanced chemical vapor deposition), in which case the nanotube growth can follow the direction of the plasma's electric field. By properly adjusting the geometry of the reactor it is possible to synthesize aligned carbon nanotubes.

Generally, the CNTs of the present invention can be electrically and thermally conductive, and have an essentially uniform diameter that is in a range from 1 micron (μm) to 3 μm and a length that is in a range from 1 μm to 10 μm. The CNTs can also be single-walled nanotubes (SWNTs) or multi-walled nanotubes (MWNTs) (e.g., double-walled nanotubes (DWNTs)). The CNTs can also have a zigzag, an armchair, or a chiral arrangement, so long as the resulting CNT-pentacene composite should exhibit good charge carrier mobility (e.g., in the range of 1 $cm^2/V \cdot sec$ to 1000 $cm^2/V \cdot sec$).

The CNTs can also be purified (e.g., by washing in a sodium hypochlorite solution) to remove any contaminants.

The CNTs are then coated with electron-rich arenes and dried. As used herein, the term "arene" means an aromatic hydrocarbon, which can contain a single ring or multiple rings or fused rings. In one or more embodiments, the arene is selected from the group consisting of optionally substituted benzene, biphenylene, triphenylene, pyrene, naphthalene, anthracene and phenanthrene or mixtures thereof.

When the electron-rich CNTs are coated onto the electron-deficient pre-patterned surface, a dipole-dipole interaction occurs to provide selective placement of the CNTs on the substrate. Advantageously, the electron-rich CNTs can be deposited in an organic solvent such as by drop casting, spin coating, or immersion coating.

After selectively placing the electron-rich CNTs on electron-deficient functionalized first layer, the arenes can be removed from the CNT such as by annealing.

Referring now to FIGS. 1-8, a method of selectively placing the CNTs onto a substrate accordingly to one or more embodiments of the present invention is given. In FIG. 1, a substrate 10 is depicted. As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

Figure 2:
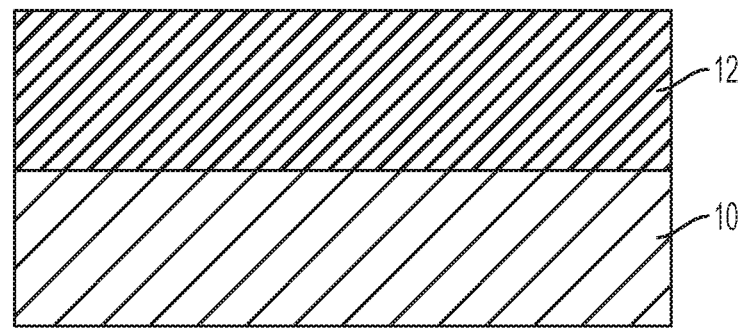
FIG. 2 depicts a cross sectional view of the substrate of FIG. 1 subsequent to deposition of a dielectric layer.

In FIG. 2, a dielectric layer 12 is deposited onto the substrate 10. The dielectric layer can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. In one or more embodiments, the dielectric layer 12 can have a thickness in a range from about 100 nm to about 1000 nm. The dielectric layer 12 is not intended to be limited and can be any dielectric. By way of example, the dielectric layer can be silicon dioxide.

Figure 3:
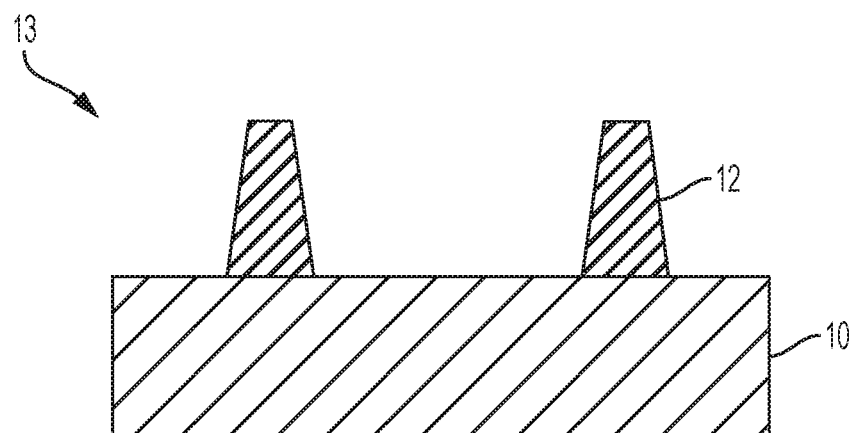
FIG. 3 depicts a cross sectional view of the substrate of FIG. 2 subsequent to lithographic patterning and etching the dielectric layer to provide at least one opening and form a topographical pattern.

In FIG. 3, the dielectric layer 12 is lithographically patterned and etched to form a desired topographical pattern 13 including at least one opening on the substrate 10. The lithographic process for the fabrication of the topographical pattern in the dielectric layer 12 generally includes deposition of a photoresist onto the surface of the dielectric layer 12. The photoresist is sensitive to radiation, e.g., extreme ultraviolet (EUV) radiation, and, depending on the photoresist used, portions of the photoresist that are exposed to the radiation can be removed (or left remaining) by a development process. The topographical pattern is then formed in the dielectric layer by etching or otherwise modifying the substrate in the areas from which the photoresist has been removed. For example, a reactive ion etch process can be used to remove portions of the dielectric layer 12 from the substrate 10. The particular pattern is not intended to be limited and can include a trench feature, a via feature, combinations thereof, or the like. As shown in FIG. 3, a line-space pattern can be formed.

Figure 4:
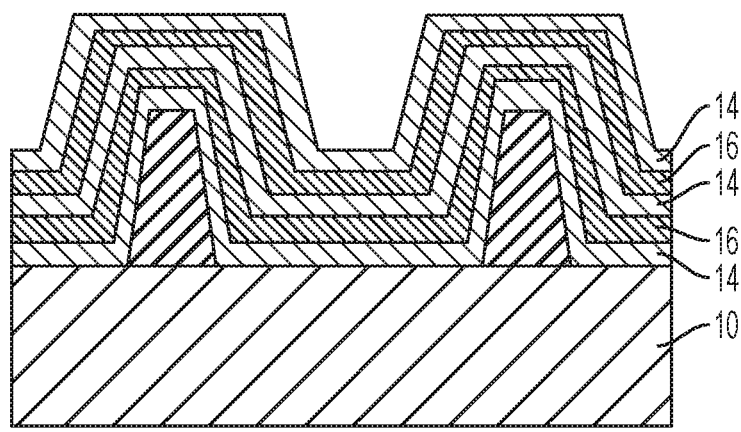
FIG. 4 depicts a cross sectional view of the substrate of FIG. 3 subsequent to alternating conformal deposition of first and second layers on the topographical patterning in accordance with one or more embodiments of the invention.

In FIG. 4, alternating conformal layers 14, 16 of different materials (i.e., one material having an affinity for CNTs and the other material having no affinity of the CNTs) are then deposited onto the substrate. Each layer 14, 16 has a thickness generally less than 5 nanometers. In one or more embodiments, the thickness of each layer is less than 3 nm, and in still one or more embodiments of the present invention, the thickness of each layer is less than 1 nm. Relative to one another, each layer can have the same thickness or a different thickness than the other layer. Still further, layers of the same material can have different thicknesses within the alternating layers. By way of example, layer 14 can be silicon dioxide ($SiO_2$) and layer 16 can be silicon nitride ($Si_3N_4$), hafnium oxide, aluminum oxide, or the like.

Figure 5:
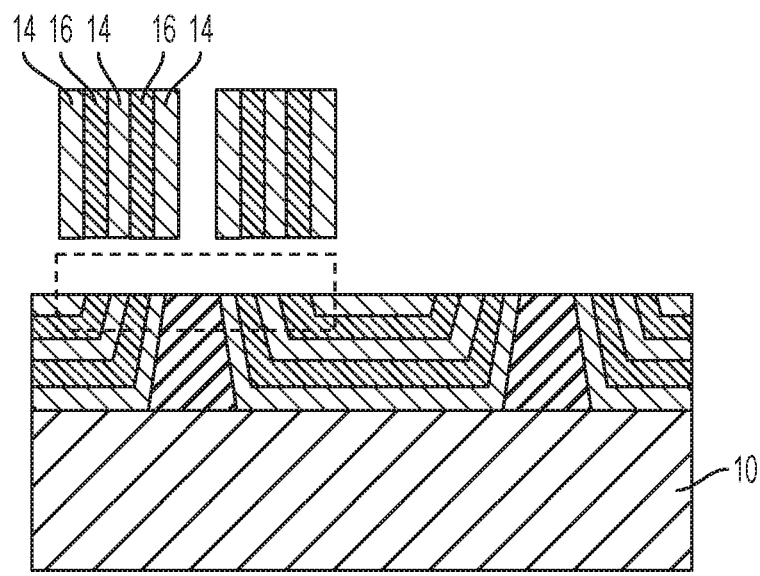
FIG. 5 depicts a cross sectional view of the substrate of FIG. 4 subsequent to planarizing the surface in accordance with one or more embodiments of the invention.

In FIG. 5, the structure is subjected to a planarization process such as a chemical mechanical planarization process. In doing so, the top surface will be defined by the alternating layers 14, 16 of a precisely defined width. Moreover, depending on the pattern provided in the dielectric layer 12, the alternating layers having the defined width can have a variety of patterns, e.g., alternating lines of different materials as shown, an island of a defined size, combinations thereof, and the like.

Figure 6:
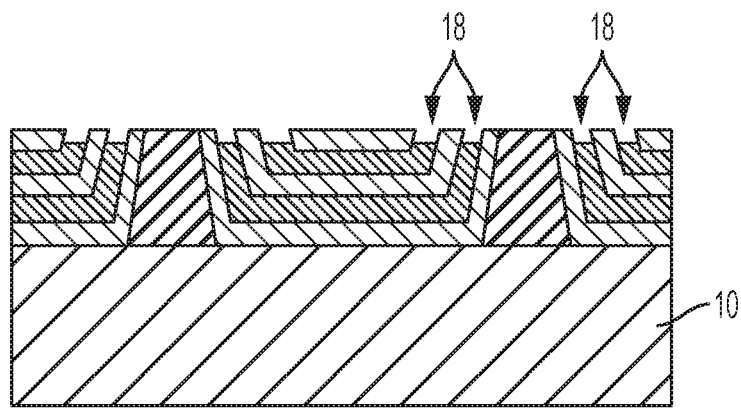
FIG. 6 depicts a cross sectional view of the substrate of FIG. 5 subsequent to optionally selective etching to create trenches in accordance with one or more embodiments of the invention.

Optionally, as shown in FIG. 6, a portion of one of the layers can be selectively removed such as by a selective wet etch process to form trenches 18.

Figure 7:
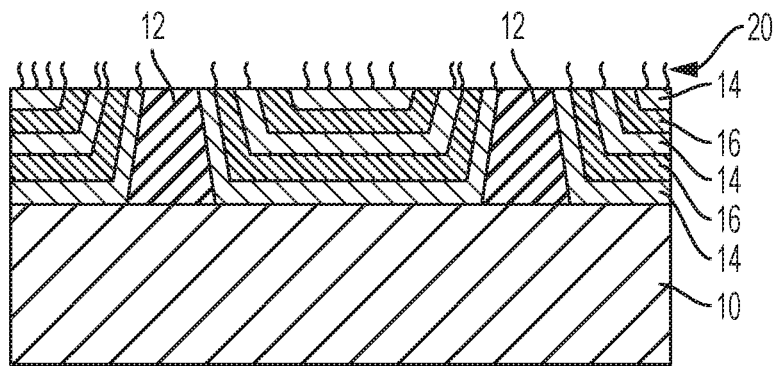
FIG. 7 depicts a cross sectional view of the substrate of FIG. 6 subsequent to functionalized the first layer in accordance with one or more embodiments of the invention.

In FIG. 7, the patterned substrate is put in contact with a solution containing a bifunctional precursor 20 such as an electron-deficient compound including a terminal hydroxamic acid or a terminal phosphonic acid group or catechol group. The terminal hydroxamic acid or the phosphonic acid or the catechol groups (i.e., the phenolic hydrogen) reacts with a selected surface and serves to anchor the electron-deficient compound to a selected one of the layers 14 or 16 that had been formed on the substrate. More particularly, the hydroxamic acid or the phosphonic acid or the catechol selectively binds to the basic material present on the substrate, e.g., $HfO_2$, so as to form a self-assembled functionalized first layer with sub-lithographic features.

Figure 8:
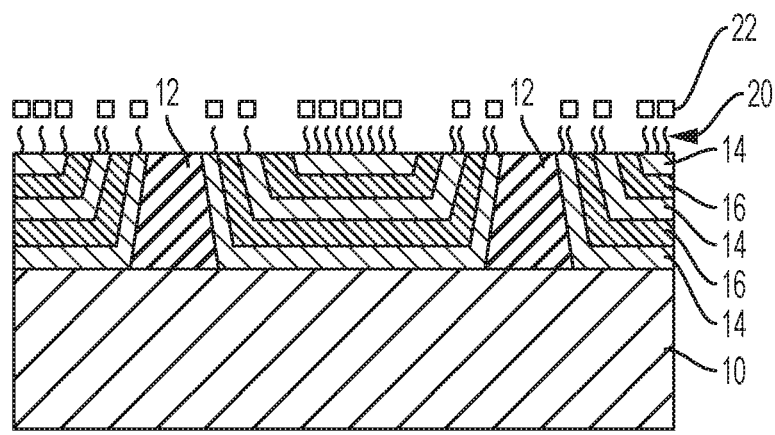
FIG. 8 depicts a cross sectional view of the substrate of FIG. 7 subsequent to selectively placement of carbon nanotubes on exposed surfaces corresponding to the first layer trenches in accordance with one or more embodiments of the invention.

In FIG. 8, the substrate 10 with the self-assembled monolayer 20 is put in contact with a solution containing CNTs, wherein the CNTs are coated with an electron-rich arene. In one or more embodiments, the solution can be an organic solvent such as but not limited to aliphatics, aromatics, and mixtures thereof such as, for example, toluene, chloroform, hexane, heptane and the like. The electron-rich CNTs 22 are electrostatically attracted to the electron-deficient self-assembled monolayer based on a dipole-to-dipole interaction. The substrate is then rinsed in a non-polar solvent to leave a CNT layer above the self-assembled monolayer. The rinsing step removes any excess CNTs to form a monolayer of CNTs 22 on the first layer. The arenes can then be removed from the CNTs such as by annealing.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A structure having selectively placed carbon nanotubes, the structure comprising:
   a topographical pattern provided in a dielectric layer including at least one opening;
   a planarized surface of alternating conformal first and second layers in the at least one opening, each of the first and second layers having a thickness of less than about 5 nanometers on the dielectric layer, wherein the planarized surface comprises an alternating pattern of exposed surfaces corresponding to the first and second layer, wherein a width of at least a portion of the exposed surfaces is substantially equal to the thickness of the corresponding first and second layers, wherein the first layer comprises a metal oxide or a metal nitride and the second layer comprises a non-metal oxide or a metal; and
   carbon nanotubes selectively placed on the exposed surfaces corresponding to the first layer.

2. The structure of claim 1, wherein the first layer has an isoelectric point greater than an isoelectric point of the second layer and is at a differential of at least 3.

3. The structure of claim 1, wherein the thickness of each one of the first and second layers is less than about 3 nm.

4. The structure of claim 1, wherein the first layer comprises hafnium oxide or silicon nitride and the second layer comprises silicon dioxide.

5. The structure of claim 1, wherein the dielectric layer comprises silicon dioxide.

6. The structure of claim 1, wherein the carbon nanotubes comprise single walled nanomaterials.

7. The structure of claim 1, wherein the carbon nanotubes comprise single-walled nanomaterials.

8. The structure of claim 1, wherein the carbon nanotubes have an outer diameter of about 0.8 nanometers (nm) to about 30 nm, and a length of about 5 nm to about 100 micrometers.

9. The structure of claim 1, wherein the carbon nanotubes have a aspect ratio within a range of about 5 to about 5000.

10. The structure of claim 1, wherein the carbon nanotubes are electron-rich arene coated carbon nanotubes.

11. The structure of claim 1, wherein the metal oxide or metal nitride comprises a metal includes at least one metal from group IVB, VB, VIB, VIIB, VIII or IIA (CAS version) of the Periodic Table of the Elements.

12. The structure of claim 1, wherein the second layer metal comprises gold, palladium, copper, or platinum.

13. The structure of claim 1, wherein the first layer has an isoelectric point greater than a pKa of an electron-deficient compound including a terminal acid group used for functionalization and the second layer has an isoelectric point less than the pKa of the electron-deficient compound.

14. The structure of claim 1, wherein the first layer and the second layer have an isoelectric difference of at least 3.

15. The structure of claim 1, wherein the first layer and the second layer have an isoelectric difference of at least 4.

16. The structure of claim 1, wherein the first layer and the second layer have an isoelectric difference of at least 5.

17. The structure of claim 1, wherein the first layer the metal oxide or the metal nitride of the first layer further comprises an electron deficient compound comprising a pendant hydroxamic acid group or a pendant phosphonic acid group or a pendant catechol group.

18. An integrated circuit comprising the structure of claim 1.

19. A device comprising the structure of claim 1.

* * * * *